United States Patent [19]
Zulaski

[11] Patent Number: 5,220,495
[45] Date of Patent: Jun. 15, 1993

[54] ARRANGEMENT AND METHOD FOR ACCURATELY SENSING VOLTAGE OF A HIGH-IMPEDANCE SOURCE AND SUPPLYING POWER TO A VARIABLE BURDEN

[75] Inventor: John A. Zulaski, Mt. Prospect, Ill.

[73] Assignee: S&C Electric Company, Chicago, Ill.

[21] Appl. No.: 761,590

[22] Filed: Sep. 18, 1991

[51] Int. Cl.$^5$ .............................................. G05F 1/613
[52] U.S. Cl. ..................................... 363/84; 323/223;
    323/358; 323/359; 324/126; 320/32
[58] Field of Search ............... 323/220, 223, 225, 226,
    323/358, 359; 363/84; 307/130, 131; 320/32;
    324/126

[56] References Cited

U.S. PATENT DOCUMENTS

| | | |
|---|---|---|
| 3,440,515 | 4/1969 | Swartz . |
| 3,771,043 | 11/1973 | Zulaski ................................. 320/39 |
| 3,882,373 | 5/1975 | Brenig ................................. 324/126 |
| 4,002,976 | 1/1977 | Zulaski ................................. 324/126 |
| 4,262,256 | 4/1981 | Blais et al. ........................... 323/223 |
| 4,567,540 | 1/1986 | Ruta ..................................... 361/93 |
| 4,571,658 | 2/1986 | Ruta ..................................... 361/96 |

FOREIGN PATENT DOCUMENTS 3806982  9/1989  Fed. Rep. of Germany .

*Primary Examiner*—William H. Beha, Jr.
*Attorney, Agent, or Firm*—James V. Lapack

[57] ABSTRACT

An arrangement is provided for accurately sensing the source voltage of a high-impedance source while supplying a variable burden. A current-sensing element is connected in series with a load circuit across a high-impedance source. The load circuit includes a variable burden load. A shunt regulator is connected with the variable burden load and is arranged to operate so that the combination of the shunt regulator and the variable burden present a controlled, nearly constant burden to the high-impedance source. The source voltage of the high-impedance source is sensed via the voltage across the series current-sensing element. While the output voltage is directly proportional to the burden, the output current is essentially unaffected by small variations in the burden. Thus, the current through the series current-sensing element is utilized to accurately sense the voltage of the high-impedance alternating-current source while also supplying the variable burden load such as a battery, electrical circuitry, and a switch operator.

18 Claims, 1 Drawing Sheet

ARRANGEMENT AND METHOD FOR ACCURATELY SENSING VOLTAGE OF A HIGH-IMPEDANCE SOURCE AND SUPPLYING POWER TO A VARIABLE BURDEN

BACKGROUND OF THE INVENTION

1. Field of the Invention

The present invention relates generally to voltage sensors and battery chargers and more particularly to an arrangement for charging a battery or supplying other variable burdens from a high-impedance source while accurately sensing the source voltage of the high-impedance source.

2. Description of the Related Art

In electrical power distribution and transmission systems, it is necessary to obtain an accurate representation of the voltage of the alternating-current source at a particular location for a purpose such as the remote supervisory control of automated distribution switching installations. It is extremely desirable for such automated distribution switching installations to be self-contained and self-powered. Thus, it is desirable to utilize the alternating-current source to power the installation. However, since the voltage of the alternating-current source is in the range of 15 to 34.5 kv or higher, a potential transformer or voltage sensing device is utilized to obtain low voltage representations of the high voltage on a conductor and to provide power for operation of the switching installation. For example, one type of voltage sensor is described in U.S. Pat. No. 4,002,976. A rechargeable power source such as a battery is provided at the switching installation to store operating power obtained from the transformer or voltage sensor and to also provide the desirable feature of emergency operation in the absence of system voltage. It is also extremely advantageous to utilize a single voltage sensor to monitor the system voltage as well as to charge the battery. However, since the battery and the supplied installation load represent a highly variable burden, there is an inherent conflict in obtaining an accurate sensed voltage signal from the voltage sensor while the voltage sensor is supplying a variable burden. That is, the difference in burden between a fully charged battery and a fully discharged battery is so great that this varying burden causes inaccuracies in the sensed voltage. This is especially a problem when the voltage sensor is a high-impedance source since this type of supply has very poor voltage regulation; i.e., the output voltage that represents the sensed voltage varies rather greatly for small changes in the burden to the extent that the sensed voltage signal does not accurately represent the input voltages.

Accordingly, various approaches have been utilized to account for these adverse characteristics. For example, U.S. Pat. No. 3,771,043 supplies the variable burden with a constant burden regulator utilizing a constant current source and a shunt regulator. The high-impedance source is connected in parallel with the fixed load and the constant burden regulator is also connected in parallel to the system. Thus, the voltage to the fixed load is accurate and essentially unaffected by the variable burden. That approach attempts to maintain an accurate voltage measurement as the sensed parameter via the maintenance of a constant overall burden. That is, the additional constant current source and the shunt regulator present a relatively fixed burden, with the shunt regulator conducting a varying current dependent on the load presented by the variable burden load. This accomplishes the maintenance of an essentially constant voltage ratio at the output of the high-impedance source to obtain an accurate representation of the voltage of the source. While this arrangement is generally suitable for particular applications, it should be noted that the constant current source dissipates power to maintain a constant current supply and that any slight variation in the maintained constant burden has a direct effect on the voltage source due to its inherent nature as a high-impedance source.

Concerning other power supply arrangements where sensing is also accomplished, U.S. Pat. Nos. 4,567,540 and 4,571,658 are directed to a trip signal generator for a circuit interrupter wherein a representation of the current in a conductor is obtained from the voltage across a resistor in series with a power supply circuit. The power supply circuit utilizes a switching shunt regulator to maintain the voltage to the power supply regulator circuit within a predetermined range or ranges according to the particular sensed conditions. While that arrangement is useful for current sources, it is not suited to supply a variable burden while accurately measuring the voltage of a high-impedance source.

SUMMARY OF THE INVENTION

Accordingly, it is a principal object of the present invention to provide an arrangement to accurately sense the source voltage of a high-impedance source while supplying a variable burden load.

This and other objects of the present invention are efficiently achieved by the provision of a current-sensing element connected in series with a load circuit across a high-impedance source. The load circuit includes a variable burden load. A shunt regulator is connected with the variable load and is arranged to operate so that the combination of the shunt regulator and the variable burden present a controlled, nearly constant burden to the high-impedance source. The source voltage of the high-impedance source is sensed via the voltage across the series current-sensing element. While the output voltage is directly proportional to the burden, the output current is essentially unaffected by small variations in the burden. Thus, the source current through the series current-sensing element is utilized to accurately sense the voltage of the high-impedance alternating-current source while also supplying the variable burden load such as a battery, electrical circuitry, and a switch operator.

BRIEF DESCRIPTION OF THE DRAWING

The invention, both as to its organization and method of operation, together with further objects and advantages thereof, will best be understood by reference to the specification taken in conjunction with the accompanying drawing in which.

DETAILED DESCRIPTION

Figure 1:
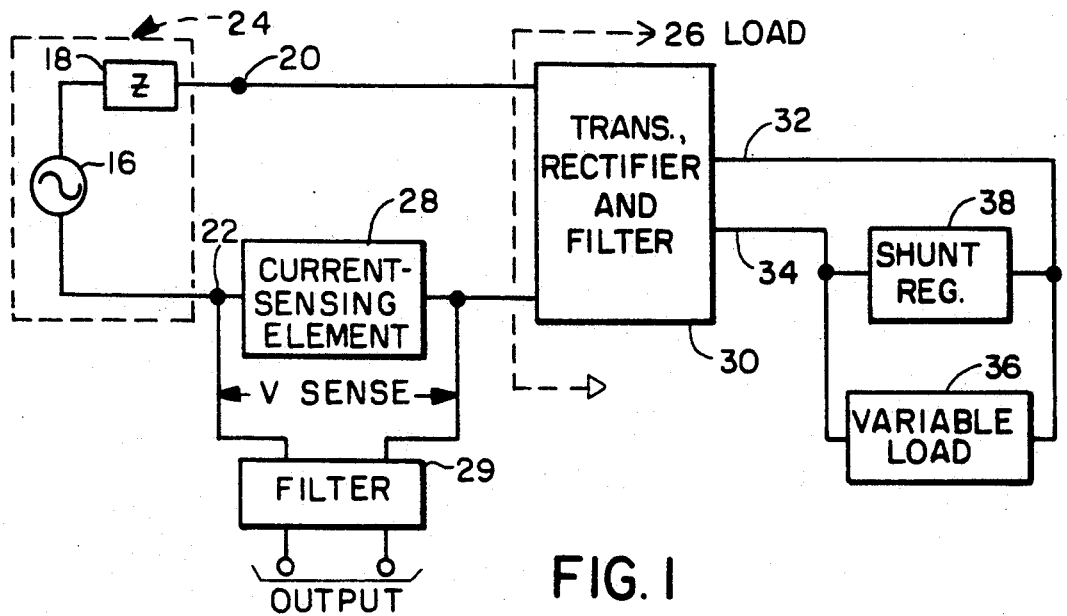
FIG. 1 is an electrical block diagram and schematic drawing of the present invention in an illustrative application.

Referring now to FIG. 1, the arrangement of the present invention is connected at circuit points 20,22 across a high-impedance source referred to generally at 24. The high-impedance source is represented by an ideal voltage source 16, i.e., an alternating-current source having no internal impedance, operating through an impedance 18 of high magnitude. A load circuit referred to generally at 26 and a current-sensing element 28 are connected in series circuit relationship across the circuit points 20,22. In an illustrative embodiment, a transformer, rectifier, and filter power supply stage 30 is connected in series with the current-sensing element 28 across the circuit points 20,22 of the source 24. The stage 30 is arranged to supply operating power across outputs 32,34 to a variable load 36 which, in a specific situation, includes a battery and additional circuit loads; e.g., a remote terminal unit (RTU), a radio transceiver, and an electrically powered switch operator for an automated distribution switch.

In accordance with important aspects of the present invention, a shunt regulator 38 is connected across the variable load 36 at the outputs 32,34 and the voltage of the source 24 is sensed via the voltage across the impedance element 28. The shunt regulator 38 is arranged to conduct so that the total combination of the shunt regulator 38 and the variable load 36 present a controlled, nearly constant burden to the outputs 32,34 of the stage 30. In turn, the stage 30 in combination with the current-sensing element 28 presents a constant burden to the source circuit at the terminals 20,22. In operation, the shunt regulator 38 senses the voltage at 32,34 and conducts to maintain a constant voltage thereacross as the burden or current drain of the variable load 36 varies. Accordingly, the burden to the source 24 is maintained very consistently such that the current through the fixed current-sensing element 28 accurately represents the voltage of the ideal voltage source 16. Thus, the current through the current-sensing element 28 varies only with the voltage of the ideal voltage source 16.

Figure 2:
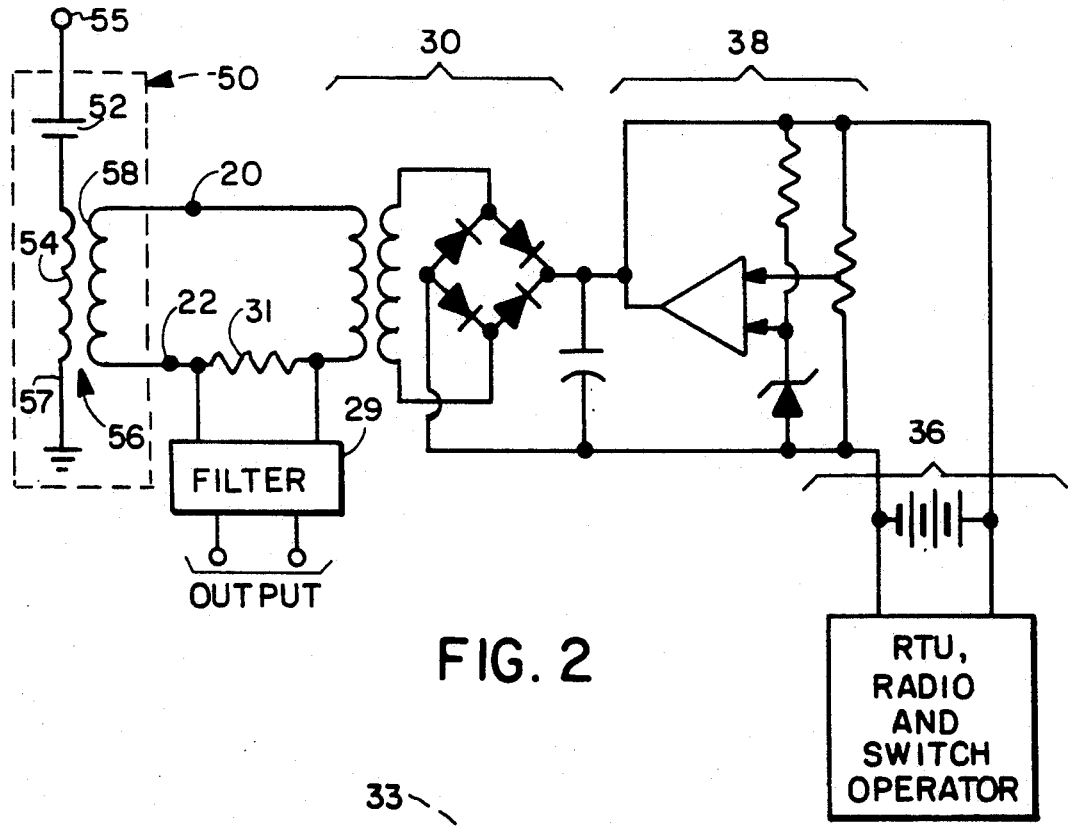
FIG. 2 is an electrical schematic drawing similar to FIG. 1 and illustrating further details that can be employed to practice the present invention.
Figure 3:
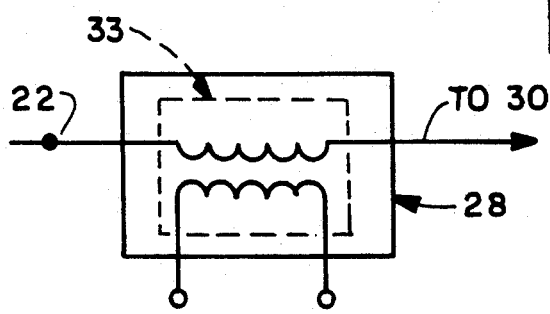
FIG. 3 is an illustrative example of a specific current-sensing element for use with the arrangements of FIGS. 1 and 2.

Due to the presence of harmonics, filtering of the sensed signal across the current-sensing element 28 is necessary where a sinusoidal signal is desired or where the phase angle is to be monitored. For example, a filter 29 is utilized to pass the components of the sensed signal at the frequency of the source 16 while attenuating other frequencies. Considering illustrative examples of the current-sensing element 28 and with additional reference to FIGS. 2 and 3, the current-sensing element 28 in one specific arrangement is a resistor 31 as shown in FIG. 2. In another specific arrangement and as shown in FIG. 3, the current-sensing element 28 is a current transformer 33.

It should be noted that in the arrangement of FIG. 1, the overall load circuit 26 can be considered a load supply circuit or a regulator circuit connected to supply a variable load. Additionally, the circuit can also be characterized as the portion 26 being a variable load with a shunt regulator being connected therewith. In the alternative, the circuit can also be characterized as the overall load circuit 26 including a variable load portion with the shunt regulator 38 being connected with the variable load portion.

Considering one specific application of the present invention in more detail and as illustrated in FIG. 2, the high-impedance source 24 is a voltage sensor 50 including a capacitor 52 connected in series with a primary winding 54 of a step-down transformer 56. A secondary winding 58 of the step-down transformer 56 is connected across the circuit points 20,22. When the voltage sensor 50 via a terminal 55 is connected to a conductor energized at a high ac voltage such as 25 kv, current flows through the capacitor 52 and the primary winding 54 of the transformer 56. The relatively high impedance of the elements 52 and 54 limits the current flow. In accordance with the step-down ratio of the transformer 56, e.g., 20 to 1, the voltage induced at the circuit points 20,22 is significantly stepped down and correspondingly the current is higher. The net result is a voltage at 20,22 that is representative of the voltage on the high-voltage conductor across 55,57 when the secondary winding 58 is connected to a constant burden. However, if the burden at 20,22 is varied, the voltage at 20,22 no longer accurately represents the voltage at 55,57 due to the voltage sensor being a high-impedance source. Accordingly, if a sensed voltage is desired that is accurate to within a few percent, it would be apparent that the voltage must be held constant at 20,22 via the control of the burden. However, the present invention illustrates that the current may also be used as an accurate representation of the voltage at 55,57 to the voltage sensor 50. Additionally, if the burden is controlled and held nearly constant, the accuracy of the sensed current signal as a representation of the source voltage is also increased.

While there have been illustrated and described various embodiments of the present invention, it will be apparent that various changes and modifications will occur to those skilled in the art. For example, it should be understood that the present invention is applicable to both direct current and alternating-current sources. For use with a direct-current source, the transformer, rectifier, and filter power supply stage 30 is deleted, such that the parallel combination of the shunt regulator 28 and the variable load 36 are connected in series with the current-sensing element 28 and the source 24. Accordingly, it is intended in the appended claims to cover all such changes and modifications that fall within the true spirit and scope of the present invention.

What is claimed and desired to be secured by Letters Patent of the United States is:

1. An arrangement for accurately measuring the source voltage of a high-impedance source while supplying a variable burden load comprising:
   a current-sensing element, the series combination of said current-sensing element and the variable burden being connected to the high-impedance source; and
   a voltage regulator being connected with the variable burden so as to maintain a constant voltage across the variable burden, the voltage developed across said current-sensing element accurately representing the voltage of the high-impedance source, said current-sensing element comprising a current transformer.

2. The arrangement of claim 1 wherein the variable burden includes a load supply circuit and a variable load, said voltage regulator comprising shunt regulator means being connected across the variable load.

3. An arrangement for accurately measuring an input voltage to a circuit supplying a load circuit including a variable burden load comprising:
   voltage sensor means connected to the input voltage and providing an output generally representative of the input voltage, said output of said voltage sensor means having the characteristics of a high-impedance source so as to behave as an ideal voltage source in series with an impedance of high magnitude such that the voltage of said output varies significantly with changes in load and is not an accurate representation of the input voltage in the presence of variations in the load on said output, a sensing element connected in series with said output of said voltage sensor means and the load circuit, the voltage developed across said sensing element being utilized to represent the input voltage; and voltage regulator means being connected with the variable burden load for maintaining a constant voltage to the variable burden load.

4. In an alternating current power system having a source that supplies a circuit having a variable load, an arrangement for sensing the voltage of the source comprising:

voltage sensor means connected to the source and providing an output generally representative of the source voltage, said output of said voltage sensor means having the characteristics of a high-impedance source in series with an impedance of high magnitude such that the voltage of said output varies significantly with changes in load and is not an accurate representation of the source voltage in the presence of variations in the load on said output;

load supply circuit means for supplying the variable load;

a sensing element connected in series with said output and said load supply circuit means;

means for sensing the voltage developed across said sensing element as a measure of the source voltage; and shunt regulator means connected across the variable load for maintaining constant voltage across the variable load in response to variations in the impedance presented by the variable load to thereby present a controlled, nearly constant burden to said output and improve the accuracy of the sensed voltage signal.

5. A method for accurately measuring the source voltage of a high-impedance source that supplies a load circuit including a variable load comprising sensing the voltage developed across a current-sensing element connected in series with the source and the load circuit to provide an output that accurately represents the source voltage, and maintaining the voltage across the variable burden at a predetermined level.

6. An arrangement for measuring the source voltage of a high-impedance source while supplying a load comprising: current-sensing means being connected in series circuit relationship with the series combination of the high-impedance source and the load, the voltage developed across said current-sensing means providing an output representing the source voltage of the high-impedance source, the source being an alternating-current source;

the load including a variable load portion and rectifying means, the rectifying means including means for supplying the variable load portion; and voltage regulator means connected across the variable load portion for maintaining a constant voltage across the variable burden.

7. The arrangement of claim 6 wherein said current-sensing means comprises a resistor.

8. The arrangement of claim 6 wherein said current-sensing means comprises a current transformer.

9. The arrangement of claim 6 wherein said voltage regulator means is of the shunt-regulating type.

10. The arrangement of claim 6 wherein the alternating-current source operates at a source frequency, the arrangement further comprising filter means connected across said current-sensing means for attenuating frequencies other than the source frequency.

11. An arrangement for accurately measuring an input voltage to a load circuit supplying a variable burden load comprising:

voltage sensor means connected to the input voltage and providing an output generally representative of the input voltage, said output of said voltage sensor means having the characteristics of a high-impedance source in series with an impedance of high magnitude such that the voltage of said output varies significantly with changes in load and is not an accurate representation of the input voltage in the presence of variations in the load on said output;

sensing means; and voltage regulator means, said sensing means and said voltage regulator means being connected in series with each other and in series combination with said output of said voltage sensor means, said voltage regulator means comprising means for providing supply connections to supply the variable burden load, the voltage developed across said sensing means being utilized to represent the input voltage.

12. The arrangement of claim 11 wherein said voltage regulator means comprises means for maintaining a constant voltage across the variable burden load.

13. The arrangement of claim 11 wherein said voltage regulator means comprises shunt regulator means being connected across the variable burden load.

14. The arrangement of claim 11 wherein said voltage regulator means comprises means for presenting an essentially constant burden to said output of said voltage sensor means while the burden of the variable burden load changes.

15. In an electrical power system having a high-impedance source that supplies power to a load circuit having a variable load portion, an arrangement for sensing the source voltage of the source comprising:

shunt regulator means connected across the variable portion; and signal providing means for providing a sensed-voltage signal representing the voltage of the source, said signal-providing means including sensing means connected in series circuit relationship between the source and the load circuit, the voltage developed across said sensing means representing the voltage of the source, the source being an alternating-current source and the load circuit including a rectifying arrangement having an output being connected to supply said shunt regulator means.

16. A method for accurately measuring the source voltage of a high-impedance source that supplies a variable load comprising the steps of:

supplying the variable load from a voltage regulator that is connected in series with the source and a current-sensing element;

maintaining the voltage across the variable load at a predetermined constant level; and measuring the voltage developed across the current-sensing element to provide a representation of the source voltage of the high-impedance source.

17. The method of claim 16 wherein the high-impedance source operates at a predetermined source frequency and said measuring step comprises filtering the voltage developed across the current-sensing element to pass the predetermined source frequency relative to other frequencies.

18. The method of claim 16 wherein the high-impedance source operates at a predetermined source frequency and said measuring step comprises outputting the voltage at the predetermined source frequency.

* * * * *